United States Patent [19]

Jones

[11] Patent Number: 5,027,326

[45] Date of Patent: Jun. 25, 1991

[54] SELF-TIMED SEQUENTIAL ACCESS MULTIPORT MEMORY

[75] Inventor: Brian W. Jones, Garland, Tex.

[73] Assignee: Dallas Semiconductor Corporation, Dallas, Tex.

[21] Appl. No.: 269,907

[22] Filed: Nov. 10, 1988

[51] Int. Cl.$^5$ .................. G11C 13/00; G11C 7/00
[52] U.S. Cl. .................................. 365/221; 365/78; 365/230.03; 365/230.04; 365/189.05; 365/189.02
[58] Field of Search ................. 365/230.05, 239, 195, 365/78, 221, 230.03, 230.04, 189.07, 189.02, 210

[56] References Cited

U.S. PATENT DOCUMENTS

| | | | |
|---|---|---|---|
| 4,663,742 | 5/1987 | Andersen et al. | 365/230.03 |
| 4,683,555 | 7/1987 | Pinkham | 365/230.03 |
| 4,692,900 | 9/1987 | Ooami et al. | 365/230.03 |
| 4,796,232 | 1/1989 | House | 365/230.03 |
| 4,797,858 | 1/1989 | Wang et al. | 365/189.05 |
| 4,833,657 | 5/1989 | Tanaka | 365/230.04 |
| 4,845,677 | 7/1989 | Chappell et al. | 365/189.02 X |
| 4,862,419 | 8/1989 | Hoberman | 365/221 X |
| 4,875,196 | 10/1989 | Spaderna et al. | 365/230.04 |

OTHER PUBLICATIONS

Shepherd and Rodgers, "Asynchronous FIFO's Require Special Attention," paper 13.2 from the 1985 IEEE International Test Conference.
IDT7201 Data Sheet, Jul. 1986, Integrated Device Technology, Inc.
Pai, "System Design/Memory Systems," *Computer Design*, Aug. 1, 1986, pp. 109-112.
Harold, "Memory Based CMOS FIFO Buffors Sport Large Capacities, Rival the Speed of Bipolars," *EDN*, Mar. 18, 1987, p. 65ff.
"Rich with Logic, Memory ICs Have Their Specialties," Jun. 11, 1987, issue of *Electronic Design*, pp. 77ff.
IDT72103 Data Sheet, Oct. 1986, Integrated Device Technology, Inc.
Hastings, "FIFOs: Rubber-Band Memories to Hold Your System Together," Application Note from Monolithic Memories, pp. 8-6 through 8-10.
"Understanding FIFOs," Application Note from Cypress Semiconductor, pp. 6-23 to 6-34.
Schuster, Chappell, Di Lonardo, and Britton: "A 20 ns 64K (4K×16) NMOS RAM," IEEE Journal of Solid-State Circuits, vol. SC-19, No. 5, Oct. 1984, pp. 564-571.
DS2001 Preliminary Data Sheet, in the 1987 Product Data Book of Dallas Semiconductor Corporation, pp. 242-258.
DS2010 Preliminary Data Sheet, in the 1987 Product Data Book of Dallas Semiconductor Corporation, pp. 259-275.

*Primary Examiner*—Robert S. Tupper
*Assistant Examiner*—Alfonso Garcia
*Attorney, Agent, or Firm*—Worsham, Forsythe, Sampels & Wooldridge

[57] ABSTRACT

A RAM-based FIFO which provides self-timing of the data outputs in read mode. When the data output is not valid, the data output drivers are in a high-impedance condition. Therefore, FIFOs using this RAM-based architecture can readily be combined to provide a wider or deeper FIFO, without introducing any additional delay whatsoever. Small differential delays are preferably introduced in the activation of the output buffers, to avoid noise on power supply lines.

47 Claims, 6 Drawing Sheets

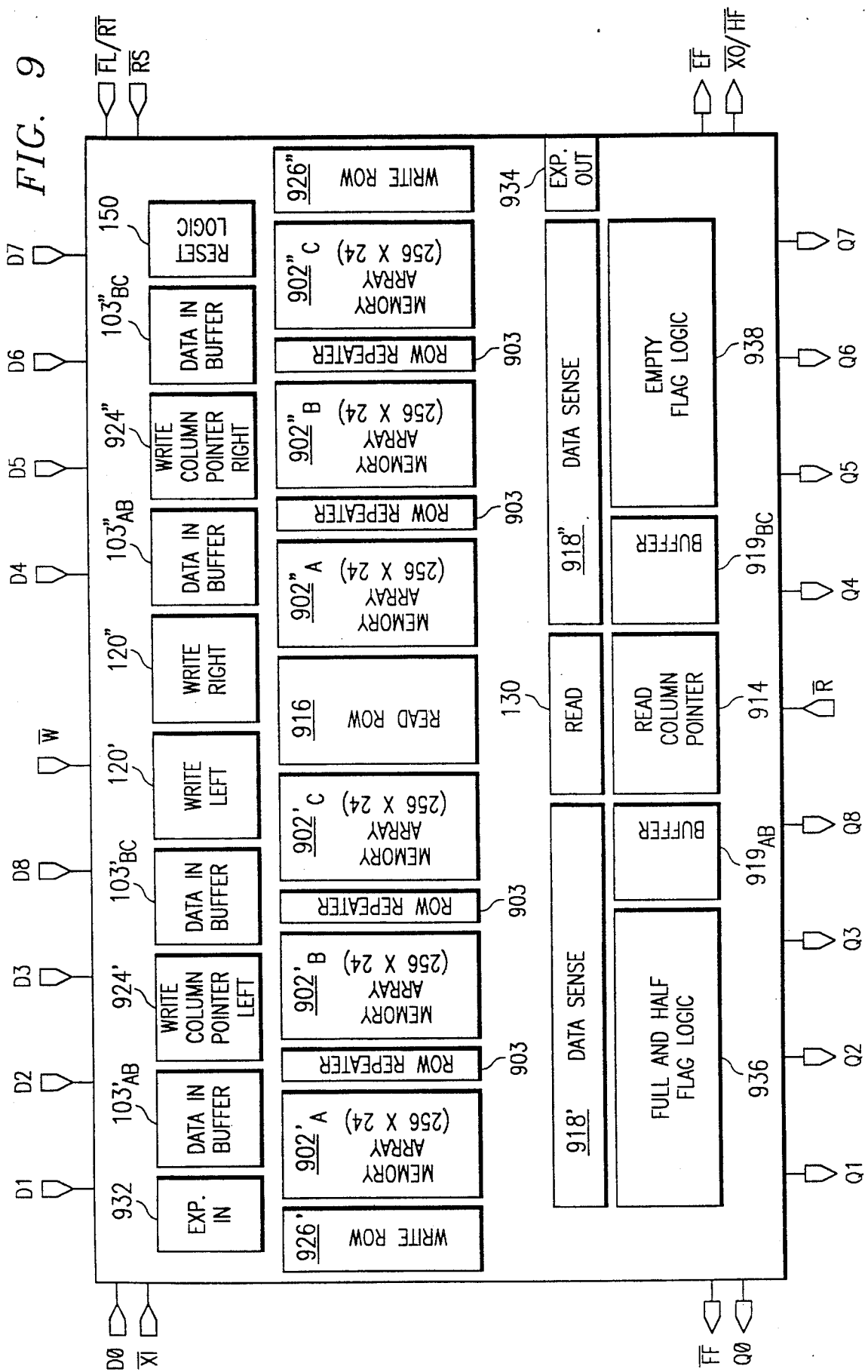

SELF-TIMED SEQUENTIAL ACCESS MULTIPORT MEMORY

PARTIAL WAIVER OF COPYRIGHT

All of the material in this patent application is subject to copyright protection under the copyright laws of the United States and of other countries. As of the first effective filing date of the present application, this material is protected as unpublished material.

However, permission to copy this material is hereby granted to the extend that the copyright owner has no objection to the facsimile reproduction by anyone of the patent document or patent disclosure, as it appears in the United States Patent and Trademark Office patent file or records, but otherwise reserves all copyright rights whatsoever.

BACKGROUND AND SUMMARY OF THE INVENTION

The present invention relates to first-in-first-out memories (FIFOs), and to analogous types of "smart" memory.

A first-in-first-out memory (FIFO) is a memory which (when the memory is being read) will output data in the same order as the data was originally written in. This functionality is very convenient for many applications, but is not always easy to implement. Some memory devices, such as charge-coupled devices or shift registers, provide an inherently serial hardware structure which can be used to provide FIFO functionality, but even these devices require some sophisticated control logic. Thus, large FIFOs are normally built using a random-access memory architecture, together with "smart" peripheral circuits which control the memory read and write operations to provide the desired functionality. In such an implementation, for example, the control logic can increment a write-address pointer each time a data packet is written, and increment a read-address pointer each time a data packet is read.

Another type of "smart" memory is LIFO memory (also referred to as "stack" memory), where the data is always read out in the opposite order to the order of writing. This architecture too is normally implemented using a random-access memory, with appropriate logic used to increment a write-address pointer each time a data packet is written, and to decrement a read-address pointer each time a data packet is read.

In the presently preferred embodiment, the FIFO architecture is RAM-based. That is, internally, this FIFO architecture uses arrays of memory cells, rather than chip registers or other technology which would require a ripple-through transfer of data from one physical location to another location. However, there are many difficulties in implementing a high-speed FIFO using a RAM-based architecture. The present invention provides a significant improvement in features of such architectures, and therefore makes it easier to configure FIFOs (or other smart memories) using a RAM-based architecture.

The present invention provides a smart memory, in which self-timing controls the timing of the data output drivers, by using dummy row elements to provide the self-timing signals to control the timing in the critical data path.

The "smart" memory architecture of such a FIFO (or other RAM-based sequentialaccess memory) is quite different from conventional architectures for mass-market semiconductor memories, such as SRAMS or DRAMS. More common memory chips will typically have address inputs, and will also have additional control signals. A typical memory chip architecture will have chip enable (CE*) and write enable (WE*) control inputs, and might also have an output enable (OE*) control input. In addition, of course, DRAMS will also have row-address-strobe and column-address-strobe (RAS* and CAS*) inputs. By contrast, this FIFO architecture has far fewer control inputs. Only two control inputs are used during normal operation, namely a W* write control input and and R* read control input.

It is believed that some large FIFOs have used an array of DRAM memory cells, without refresh circuits. Such FIFOs are inherently best suited for video buffers, since their volatility means that data residence time must be stringently limited.

It should also be noted that RAM-based FIFO architectures are significantly different from the architectures of conventional video DRAMs. From a system point of view, the primary function of video RAMs is to provide a random-access memory whose contents can be read out in blocks at very high speed. Thus, the serial access is normally read-only. Thus, this architecture is quite different from that of a FIFO or LIFO, where two address pointers are maintained, one for read access operations and one for write access operations. Moreover, although video RAMs are normally dual-ported externally, they are normally not dual-ported at the cell level: each cell will normally be accessible by only one word line.

Note that Schuster et al., "A 20-nsec 64K (4K × 16) NMOS RAM," 19 *Journal of Solid-State Circuits* 564 (1984), describes a memory which includes a dummy row used to define timing relations.

The preferred architecture of the smart memory of the presently preferred embodiment uses a dual-ported array of memory cells, where each cell is connected, through two pass transistor pairs, to two bitline pairs. One of the bitline pairs from each cell is connected to the column logic controlled by the write-access control logic, and the other bitline pair from each cell is connected to the column logic controlled by the read-access control logic. Thus, read-access and write-access are fully independent and asynchronous. The FIFO memory, in the presently preferred embodiment, also provides full, empty, and half-full flags, and unlimited expansion capability in both width and depth. This architecture is generally described in the DS2010 and DS2001 preliminary data sheet, in the 1987 Product Data Book of Dallas Semiconductor Corporation. However, it should be appreciated that the innovative concepts disclosed herein could also be applied to other system contexts, and particularly to other kinds of smart memories. In particular, these innovations may also advantageously be applied to LIFO memories. The disclosed innovative concepts may also, less preferably, be applied to a variety of asynchronous state machines. Less preferably, these concepts can also be applied to other multiport memories generally, to provide asynchronous control of data valid flags.

The present invention provides a RAM-based sequential-access multiport memory, where dummy elements are used to provide a self-timed output. The outputs are not driven active until a time indicated by an internal delay timer. The internal delay timer includes a dummy row line, so that the time constant of the delay line tracks the time constants of the actual integrated circuit elements which provide the memory array.

This has the advantage of providing a time delay, from the time that the read control signal R* goes active (by showing a falling edge), which is minimal for each particular memory chip. That is, as is well known in the art of integrated circuit manufacturing, the normal variation in device parameters during manufacture of integrated circuits will cause some variation in device characteristics. For example, the thickness of polysilicon or metal thin film lines may vary slightly, due to changes in the deposition conditions. The thickness and surface-state charge ($Q_{SS}$) of gate oxides or oxynitrides may also vary significantly. A particularly important source of variation is normal linewidth variation during lithography. That is, for a given drawn pattern and target linewidth dimension, the line-to-space ratio of the resulting pattern can easily vary by plus or minus twenty percent or more, depending on the normal variations in the photo resist exposure and development process. These considerations imply that the sheet resistance of thin film conductors may vary, the capacitance of capacitors (such as MOS gates) may vary, and also that the transconductance of MOS transistors may vary. All of these electrical parameter variations (which result from device parameter variations) can lead to a net change in the time constants of various circuits, and therefore to some net change in the delay of the circuit.

By providing an adaptive delay element, the delay until valid data is driven out on the data out lines $Q_0$ through $Q_8$ is kept at the minimum level, for each particular integrated circuit, which is consistent with the desired degree of reliability. This has the advantage that the need for external control logic is minimized. This has the further advantage that the effective net speed of every such smart memory chip will be exactly as fast as is possible for that particular chip. Thus, devices can simply be sorted according to their access time. Moreover, this self-timing capability means that the design of systems to interface with such memory chips is made simpler. The system using such a chip does not need to "know" what the access time of the chips being used is. If faster chips are inserted into such a system in place of slower chips, the system will simply run faster (if the system is able to make use of the extra speed).

In the preferred memory architecture, the outputs of the FIFO memory are tristated after every read access. That is, when the R* line is brought low, the output drivers at pins $Q_0$ through $Q_8$ are normally kept in a tristated (high-impedance) condition, except when they are carrying valid data. Note that the tristate output capability, in the presently preferred embodiment, contributes directly to the very simple depth expansion capability of FIFOs according to the present invention.

A further innovative feature relates to the way in which successive bytes are mapped into the memory array. The memory array, in the presently preferred embodiment, includes left and right half-arrays. Each of the half-arrays includes nine groups of columns, with each group of columns used to store the data for one bit-position of a byte. Thus, in the presently preferred embodiment, each byte is contained entirely within one of the two half-arrays. (In the presently preferred embodiment, each group of columns (for one bit-position) on each side of the array includes 8 columns, but of course this can be varied in accordance with the size of the memory.) The three least significant bits of the address are used to select one of these eight columns, and the next most significant bit is used to select the left or right half-array. This means that successive read operations (or successive write operations) will "ping-pong" between the two sides of the array: after a write operation has occurred in a row within one half-array, no further write operation will normally occur in any other row of that half-array until a write operation has also occurred within the corresponding row of the other half-array. Note that this relation could also be achieved with a different organization of the address bits: another way to state this relation is that the address bit which determines left/right selection is less significant than any of the bits which define row selection (within a given subarray). Thus, this advantageous relation could also be achieved if the column-select bits were not entirely confined to the least significant address bits, and/or if subarray-select bits were also used (in an embodiment which included multiple subarrays). (Since the read and write operations are independent, the read and write operations are independently ping-ponged in this fashion.)

The "ping-ponging" relation is advantageous, because it lowers the current requirements of the memory array's operations. The various peripheral circuits which are required for the memory hardware (such as precharge operations on the read side, or data set-up on the write side) are replicated for the two half-arrays. This means that these circuits can take advantage of the guaranteed 50% idle time which the serial access to the FIFO's array provides. This is also advantageous, because it allows the address pointer to be updated for the half-array, to save access time. (In the presently preferred embodiment, this is performed on the write side but not on the read side.)

In the presently preferred embodiment, the output pins do not all receive data simultaneously. Instead, data is driven onto three pins, and then onto three more pins (while the first three pins continue to be driven with valid data), and then onto the last three pins. Thus, three stages of edges occur before all nine pins have valid data. This separation of the transition times helps to minimize the electrical noise on the power supply lines. Thus, this separation of the transition times simplifies the output buffer design, since the output buffer is not required to include "despike" circuitry.

In the presently preferred embodiment, this separation of transition times is achieved by the use of multiple tap positions on the dummy row line which provides self-timing for the output data. (The sequence of the transitions is actually dependent on the physical position of the columns of the memory array, so that the sequence will actually be different during accesses to the left and right half-arrays.) Only a small separation in time is needed to provide the desired reduction in electrical characteristics, and this timing arrangement permits the improved electrical characteristics to be achieved without significant degradation in access time: the net access time for the full byte of data will always be determined by the slowest bit. Thus, by the use of this optional innovative feature, the self-timing arrangement provided by the present invention has the further advantage that split timing signals are provided to minimize electrical noise effects of the output buffers, without any significant loss of access speed.

In the art of static random access memories (SRAMs), some architectures use delay elements connected so that the different portions of the memory peripherals are activated only at times when they are needed. For example, in a sample SRAM architecture, a transition detector will detect any change in the input address, and will bring up the word line drivers in time for the word line corresponding to the selected row to be driven high as rapidly as possible. At the same time, or shortly thereafter, the precharge circuitry will be activated, to precharge the bit line pairs of each column of cells to equal potentials. Thus, when the selected word line is driven high to open the pass transistors of the selected cells, each selected cell can begin to develop a signal on its bit line pair as rapidly as possible. With a further delay imposed, the sense amplifiers may be driven active, so that the sense amplifiers will rapidly amplify the signal developed on the bit line pair as soon as that signal begins to be developed. That is, where a dynamic sense amplifier is used, it will typically be brought up to its metastable (and amplifying) state as soon as it can reliably be expected that data will be present on the bit lines. If the sense amplifier becomes active later, the access time of the memory chip is thereby degraded. If the sense amplifier becomes active earlier, there is some risk that the sense amplifier may be triggered by electrical noise on the bit line pair, to produce an incorrect data output. Dummy rows and dummy columns have been used to produce appropriate delays for such self-timed SRAM architectures.

BRIEF DESCRIPTION OF THE DRAWING

The present invention will be described with reference to the accompanying drawings, which show important sample embodiments of the invention and which are incorporated in the specification hereof by reference, wherein:

FIG. 9 shows the high-level physical organization of the FIFO memory of the presently preferred embodiment.

DESCRIPTION OF THE PREFERRED EMBODIMENTS

The presently preferred embodiment of the invention happens to be a first-in-first-out (FIFO) memory which is 4,096 bytes deep, and uses 9-bit bytes. However, of course, the described innovations can be applied to any other desired FIFO size. Moreover, the described innovations can also readily be applied to other sequential-access multiport memories, such as stack memories. Moreover, it is also possible, although less preferable, that the disclosed innovations could be applied to other types of "smart" memory architectures.

In the present application, complemented logic signals will normally be written with an asterisk. Thus, RS* is a complemented reset signal, and the chip is commanded to be reset when the RS* signal goes low. However, it should be noted that complemented signals are also conventionally referred in several other ways. Such signals may also be written with an overline (e.g. as $\overline{RS}$). Such signals are commonly pronounced, and sometimes written, as if a suffix "bar" were added to the signal name. Thus, for example, the complemented row address strobe signal $\overline{RAS}$ is sometimes written as RAS-bar. To further complicate terminology, complemented signals are sometimes also conventionally referred to (particularly in electrical wiring designations) by using a suffix of "Z". Thus, for example, the bit line pair for column 23, in a conventional memory architecture, might be referred to as "COL_23" and "COL_23Z".

Figure 1:
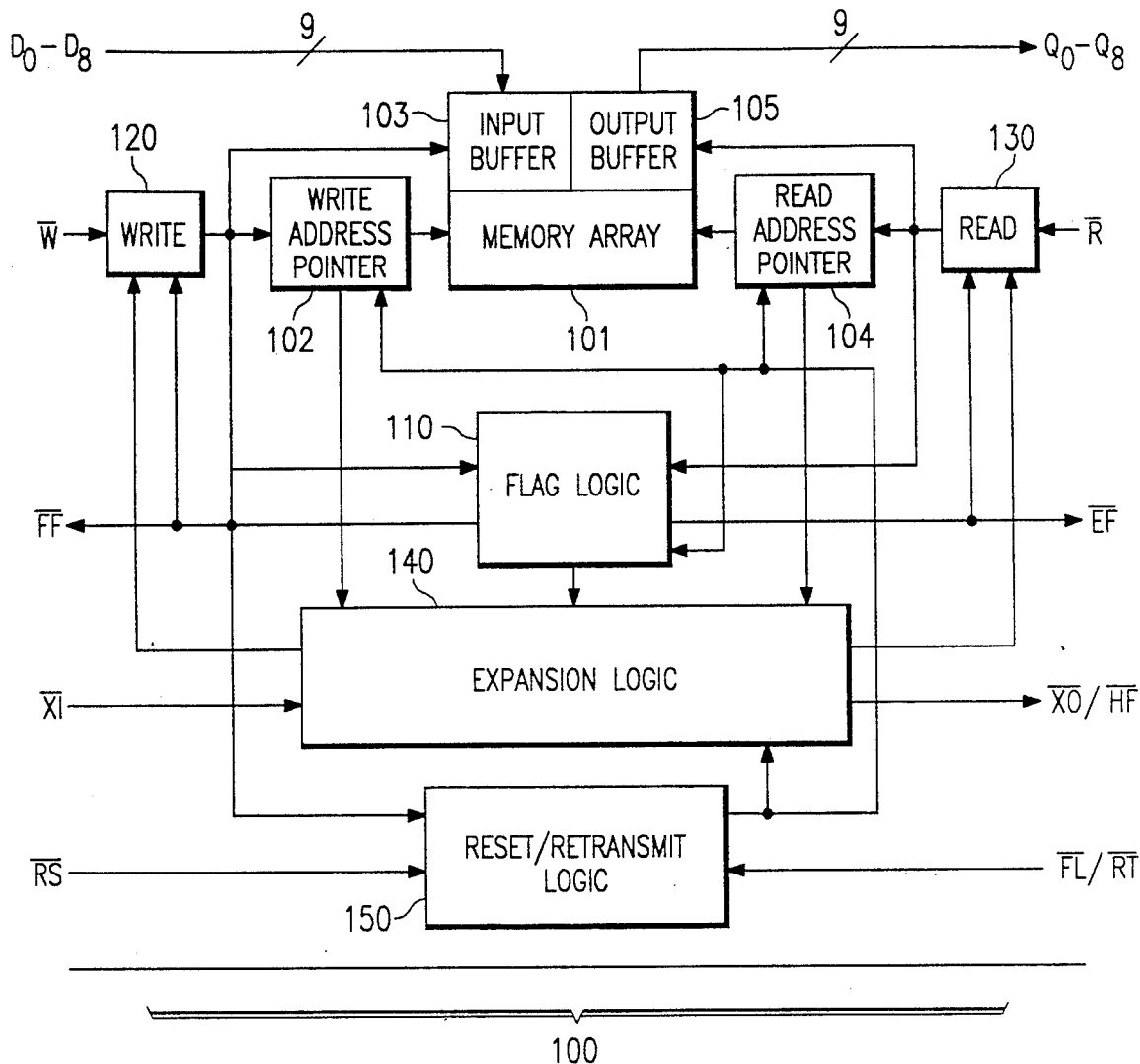
FIG. 1 schematically shows the organization of the FIFO of the presently preferred embodiment.

FIG. 1 shows the general architecture of the memory of the presently preferred embodiment. Data is stored in an array of memory cells 101. When a write command is received, write control logic 120 causes the last valid data received in input buffer 103 (from data input lines $D_0$ through $D_8$) to be written into the location, within memory array 101, which is indicated by write address pointer 102. (However, this will not occur if the full flag FF* has been driven low by flag logic 110.) A write command is indicated by a rising edge on line W*. Similarly, when a read command is received, the read control logic 130 will cause data to be read out of the memory array 101, from the address indicated by read address pointer 104, and be driven (through output buffer 105) onto data output lines $Q_0$ through $Q_8$. A read command is indicated by a falling edge on line R*.

Figure 4:
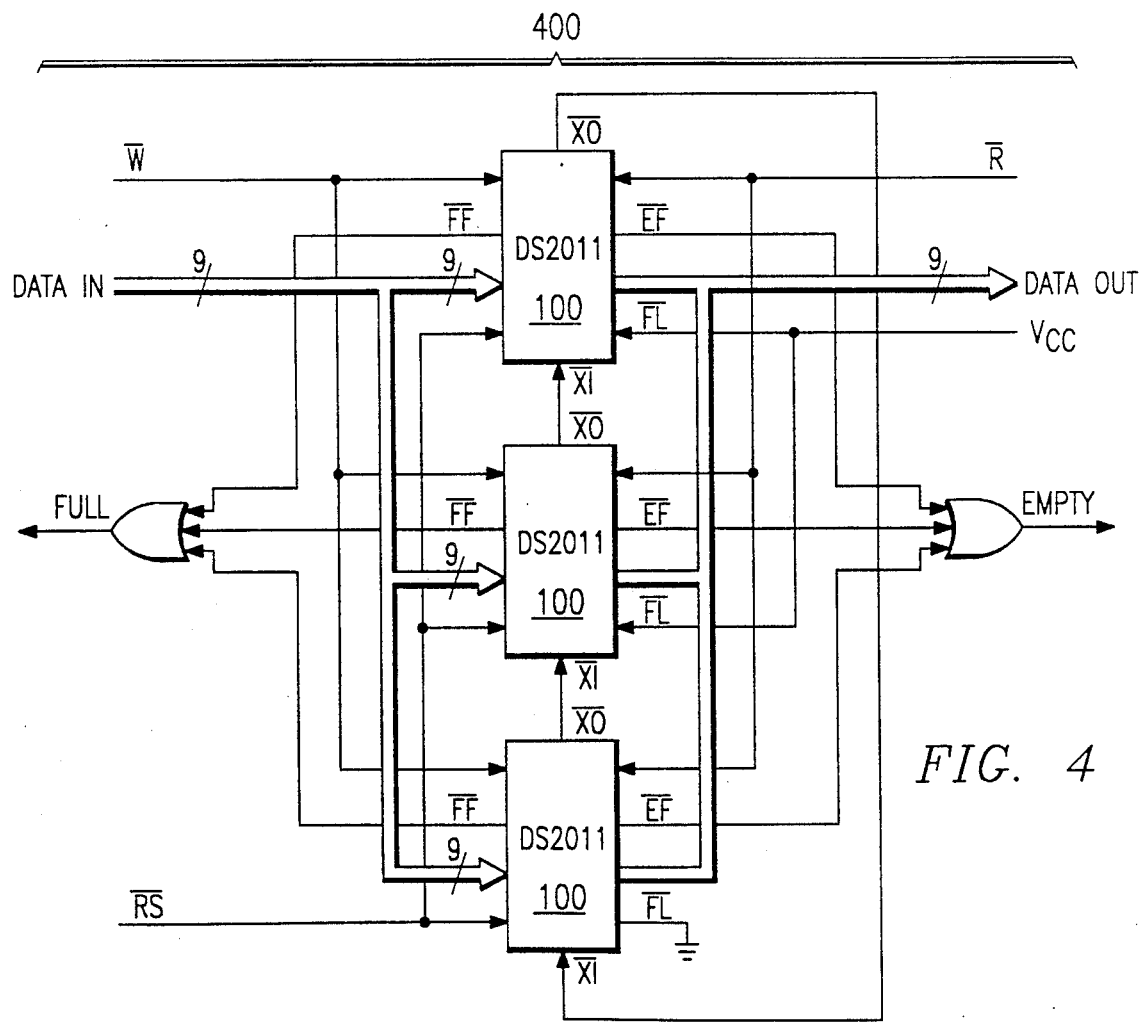
FIG. 4 is a triple-depth FIFO configuration, and illustrates the architectural capabilities for depth-expansion of the FIFO of FIG. 1.

In addition, expansion logic 140 permits multiple such FIFOs 100 to be combined, as shown in FIG. 4, to achieve a FIFO of any desired depth. This expansion logic conditions the operation of the read and write control logic 120 and 130, based on the history of the incoming expansion signal XI*. Finally, reset/retransmit logic 150 provides reset functions, including resetting the address pointers. If the expansion capability is not being used, this logic also provides a retransmit function, whereby the read address pointers 104 can be reset to zero, without resetting the write address pointers, so that a previously read output can be retransmitted. (To use this capability in a system, any associated device which receives data from the FIFO preferably provides a reset command at the beginning of each transaction, so that the associated device knows which bytes in the data stream correspond to physical address zero in the FIFO.)

The detailed architecture and configuration of the FIFO memory chip of the presently preferred embodiment will now be described in great detail. However, it should be appreciated that the numerous details given are merely illustrative, and can be modified and varied in a tremendous variety of ways.

FIG. 9 shows the high-level physical organization of the FIFO memory of the presently preferred embodiment. The representation shown in FIG. 9 is not only closer to the physical relations of the circuit portions, but is also more detailed than the representation of FIG. 1. Thus, array 101 is shown in greater detail as six blocks 902 plus four repeaters 903. The write management logic 120 is shown in greater detail as left-side write management logic 120' and right-side write management logic 120''. The write address pointer 102 is shown in greater detail as left-side write column pointer 924′, right-side write column pointer 924″, left-side write row logic 926′, and right-side write row logic 926″. The read address pointer 104 is shown in greater detail as read row logic 916 and read column pointer 914. The input buffer 103 is shown in greater detail as left-side and right-side buffers 103′ and 103″, each of which is split into two parts. The output buffer 105 is shown in greater detail as a split buffer 919 combined with two sense amplifier sets 918′ and 918″. The expansion logic 140 is shown in greater detail as expansion-in logic 932 and expansion-out logic 934. The flag logic 110 is shown in greater detail as full-and-half flag logic 936 and empty flag logic 938.

The array 101, in the presently preferred embodiment, is configured (as shown in FIG. 9) as two half-arrays. Six blocks of memory cells 902 are used. Each block 902 includes, in the presently preferred embodiment, 256 rows and 24 columns of cells. These cells are fully dual-ported: each cell contains a latch, and the two nodes of this latch are each connected to two pass transistors. A first word line controls a first pair of pass transistors, and, if this first pair of transistors is turned on, the cell's latch nodes will be connected to a first pair of bit lines. A second word line controls a second pair of pass transistors, and, if this second pair of pass transistors is turned on, the cell's latch nodes will be connected to a second pair of bit lines (regardless of whether the first pair of pass transistors is or is not also turned on). Thus, for each column of cells, two bitline pairs run across the array (vertically, in the orientation shown in FIG. 9): one bitline pair provides the write control logic with write access to the cells of that column, and the other bitline pair provides the read control logic with read access to the cells of that column. Similarly, for each row of cells, two wordlines run across the array: one wordline controls whether the cells in this row will be connected to the respective bitline pairs which provide read access (through the read control logic), and the other wordline controls whether the cells in this row will be connected to the respective bitline pairs which provide write access (through the write control logic).

In the presently preferred embodiment, the array 101 is actually built using NMOS static memory cells in single-metal dual-polysilicon process technology. (The word lines are built in polysilicon, and the bit line pairs in metal.) However, as will readily be appreciated by those skilled in the art of static memory design, an immense variety of other cell implementations, in CMOS or other technologies, could readily be substituted for this example.

This memory is organized as 4096×9. That is, the memory contains 4096 9-bit bytes. Within the array, each byte may be physically located in any one of 256 rows and any one of 8 columns, in either one of two half-arrays. Thus, the 24 columns of each of the blocks 902 are assigned to three different bit positions of the 9-bit byte. (The three blocks 902″ provide 9 bit positions within the left half-array, and the three blocks 902″ provide 9 bit positions within the right half-array.)

Internally, 12 address bits $A_0$–$A_{11}$ are required to specify the address of the 4096 bytes. As noted above, the read address pointer operation and the write address pointer updates are normally performed so as to implement a ring counter function. Therefore, in relation to the physical organization used, a choice must be made as to which bits of the address count will be used to select which elements of the physical memory arrays.

In the presently preferred embodiment, the least significant three address bits $A_0$–$A_2$ specify one of eight columns within the blocks 902, the next most significant address bit $A_3$ specifies the half-array side, and the remaining 8 address bits $A_4$–$A_{11}$ specify one of 256 rows (word lines) $WL_0$–$WL_{255}$. As noted above, the use of a left-right address bit which, in the address counting order, is less significant than the row address bits, means that sequential groups of eight accesses (performed by either port of the memory) will "ping-pong" back and forth between the two half-arrays: for example, a group of eight right-side read operations will be followed by a group of eight left-side read operations, and so forth. However, the mapping of the other address bits is less critical.

The actual hardware implementation of this address count relation uses an eight-stage ring counter to select one of eight columns. This lowest-level counter is incremented every time a read operation occurs. The next higher stage is a four-stage ring counter, which is incremented once in every eight accesses. The output of this counter selects between left and right half-arrays, and also provides the lowest-order row address bit $A_4$, which selects the odd- or even-number wordline ($WL_{2n}$ or $WL_{2n+1}$) of each adjacent pair of wordlines $WL_{2n}/WL_{2n+1}$. The highest stage is a 128-stage shift register counter, containing 128 flip-flops, which selects one pair of wordlines ($WL_{2n}$ and $WL_{2n+1}$) in either the left or right half-array.

Thus, read management logic 130 receives the incoming read command R*, and initiates a read operation if the FIFO is not empty. Read row logic 916 maintains nine of the address bits, as described above, and, when commanded by the read management logic 130, drives a high voltage onto the word line indicated by these bits.

The read row logic is actually connected to drive 257 pairs of wordlines: in addition to the 256 word lines on each side which are selected by 8 bits of the address, a dummy word line is also provided. This dummy word line passes through the row repeaters 903, just as the word lines $WL_0$–$WL_{255}$ do, and is loaded with MOS capacitors to emulate the capacitive loading imposed on word lines $WL_0$–$WL_{255}$ by the pass transistor pairs in each column. This dummy wordline is tapped, after passing through each of the blocks 902 (i.e. at three different points in each half-array). The three tap outputs are each connected to a gating circuit which activates the sense amplifiers for the three bit positions of the respective block 902. That is, in the presently preferred embodiment, the bit positions in left and right half-arrays are (from left to right) 0,1, 2, 3, 8, 4, 5, 6, and 7. When a word line is selected on the left half-array, 3 of the 24 columns in block 902′$_A$ contain the data which will eventually be driven, by data-out buffer 919, onto output contacts Q0, Q1, and Q2. Similarly, 3 of the 24 columns in block 902′$_B$ contain the data which will be driven, by data-out buffer 919, onto output contacts Q3, Q8, and Q4, and 3 of the 24 columns in block 902′$_C$ contain the data which will be driven onto output contacts Q5, Q6, and Q7. Similarly, when a word line in the right half-array is selected, 3 of the 24 columns in block 902″$_A$ contain the data which will eventually be driven, by data-out buffer 919, onto output contacts Q0, Q1, and Q2; 3 of the 24 columns in block 902″$_B$ contain the data which will be driven onto output contacts Q3, Q8, and Q4; and 3 of the 24 columns in block 902″$_C$ contain the data which will be driven onto output contacts Q5, Q6, and Q7. Thus, it may be seen that the slight relative delays induced by the multiple taps on the dummy word line will be different for left-side and right-side accesses. During left-side read operations, pins Q5-Q7 will be the first to transition from their high-impedance state to carrying valid data; pins Q3, Q4, and Q8 will transition next; and pins Q0-Q2 will transition last. During right-side read operations, pins Q0-Q2 will be the first to transition from their high-impedance state to carrying valid data; pins Q3, Q4, and Q8 will transition next; and pins Q5-Q7 will transition last. The relative delays due to the multiple taps on the word lines will typically be fairly small (of the order of 1-3 nsec); but even such small delays can make a significant improvement to the noise coupling into the power supply and ground lines. The same enable signals which are used to activate the sense amplifiers in groups are also propagated along, by simple logic gates, to control the timing of the output buffers.

Two banks of sense amplifiers are connected to the bitline pairs which extend through each column of cells in the blocks 902: a left-side bank 918' of nine sense amplifiers is connected to the left-side blocks 902', and a right-side bank 918'' of nine sense amplifiers is connected to the right-side blocks 902''. (Of course, each column of cells also is also traversed by a second bitline pair which is not connected to the sense amplifier banks 918, but instead is connected to the elements of write control logic, as will be described below.) The nine outputs from the selected sense amplifier bank (918' or 918'') are connected to nine output buffers 919.

Each of the blocks 902 also contains a one-of-eight multiplexer, which is controlled by decoded outputs from the read column pointer logic 914, to select one of 8 columns from each column group.

The operation of the write control logic is similar, but simpler. The self-timing relation used to control the output timing on the read port of the memory is not need on the write side. The sequence of memory locations used by the write control logic must, of course, be exactly the same as that used by the read control logic, so that the address bits $A_0$-$A_{11}$ used by the write port are identically allocated to the physical locations of the cells in the array. Moreover, to simplify routing, many portions of write control logic are duplicated for the left and right half-arrays: thus, in place of the single read management logic 130, the write port uses left-side write management logic 120' and right-side write management logic 120''. In place of read column pointer logic 914, the write control logic uses a pair of write column pointers 924' and 924'' (operating in parallel). In place of read row logic 916, the write control logic uses a left-side write row logic 926' and a right-side write row logic 926''. In place of the read column pointer logic 914, the write control logic includes a left-side write column pointer logic 924' and a right-side column pointer logic 924''.

Two Data-In buffers 103 are connected, in parallel, to buffer the data on lines D0-D8. (Each of the two buffers 103 is physically located in two separate parts: the first five bit positions are routed through buffers 103''$_{AB}$ and 103'$_{AB}$, and the next four bit positions are routed through buffers 103'$_{BC}$ and 103''$_{BC}$. Similarly, output buffer 919 is physically divided into two areas 919$_{AB}$ and 919$_{BC}$, even though the operation of the output buffer is not duplicated.)

The FIFO memory chip of the presently preferred embodiment implements a first-in, first-out algorithm, featuring asynchronous read/write operations, full, half-full, and empty flags, and unlimited expansion capability in both word size and depth. The main application of the FIFO memory chip of the presently preferred embodiment is as a rate buffer, sourcing and absorbing data at different rates (e.g., interfacing fast processors and slow peripherals). The full and empty flags are provided to prevent data overflow and underflow. A half-full flag is available in the single-device and width-expansion configurations. The data is loaded and emptied on a first-in, first-out (FIFO) basis, and the latency for the retrieval of data is approximately one load cycle (write). Since the writes and reads are internally sequential, thereby requiring no address information, the pinout definition will serve this and future higher-density devices. The ninth bit is provided to support control or parity functions.

Unlike conventional shift register based FIFOs, the FIFO memory chip of the presently preferred embodiment employs a memory-based architecture wherein a byte written into the device does not "ripple-through". Instead, a byte written into the FIFO memory chip of the presently preferred embodiment is stored at a specific location in memory array 101, where it remains until over-written. The byte can be read and reread as often as desired. Twin address pointers (ring counters) 102 and 104 automatically generate the addresses required for each write and read operation. The empty/full flag circuit 110 prevents illogical operations, such as reading un-written bytes (reading while empty) or over-writing un-read bytes (writing while full). Once a byte stored at a given address of array 101 has been read, it can be over-written.

Address pointers 102 and 104 automatically loop back to address zero after reaching address 4095. The empty/full status of the FIFO is therefore a function of the distance between the pointers 102 and 104, not their absolute location. As long as the pointers do not catch one another, the FIFO can be written and read continuously without ever becoming full or empty.

Resetting the FIFO (by dropping signal RS*) simply resets the address pointers 102 and 104 to address zero. Pulsing retransmit line RT* resets the read address pointer 104 without affecting the write address pointer 102.

With conventional FIFOs, implementation of a larger FIFO is accomplished by cascading the individual FIFOs. The penalty of cascading is often unacceptable ripple-through delays. The FIFO memory chip of the presently preferred embodiment allows implementation of very large FIFOs with no timing penalties. The memory-based architecture of the FIFO memory chip of the presently preferred embodiment allows connecting read control line R*, write control line W*, data-in lines $D_0$ and $D_8$, and data-out lines $Q_0$ and $Q_8$ of many FIFOS in parallel. The write and read control circuits of the individual FIFOs are then automatically enabled and disabled through the expansion-In and expansion-out pins XI* and XO*, as appropriate.

Single Device Configuration

Figure 2:
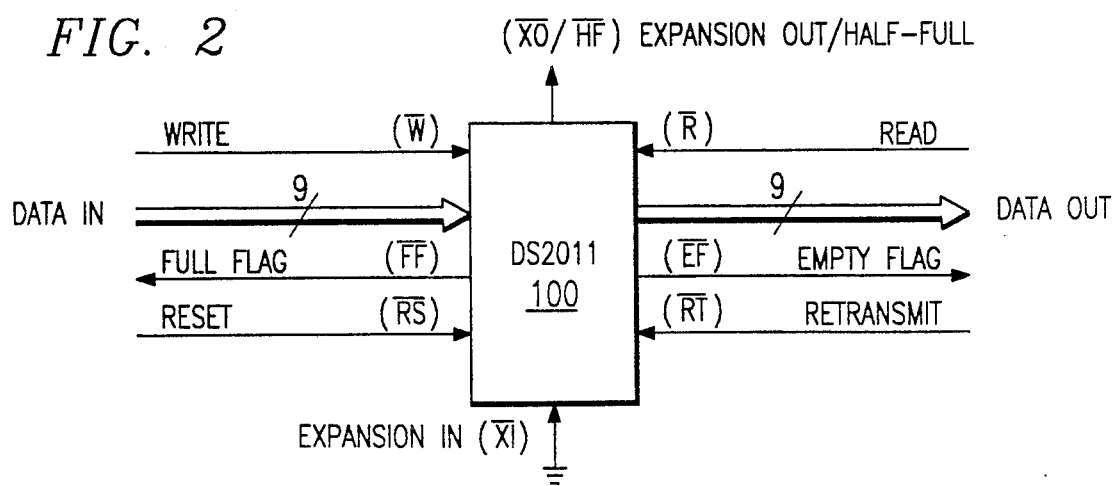
FIG. 2 is a schematic representation of a single 4096×9 FIFO configuration.

A single FIFO memory chip of the presently preferred embodiment may be used when application requirements are for 4096 words or less. The FIFO memory chip of the presently preferred embodiment is placed in Single Device Configuration mode when the chip is Reset with the Expansion-In pin XI* grounded (see FIG. 2).

Width Expansion

Figure 3:
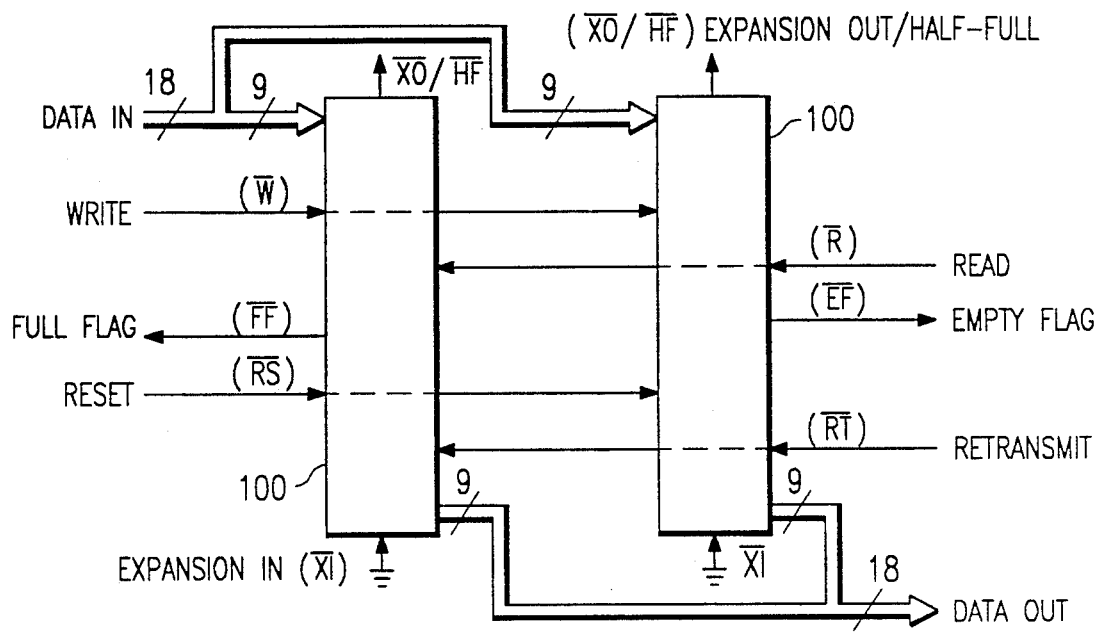
FIG. 3 is a double-width FIFO configuration, and illustrates the architectural capabilities for width-expansion of the FIFO of FIG. 1.

Word width may be increased simply by connecting the corresponding input control signals of multiple devices. Status Flags EF* and FF* can be detected from any one device. FIG. 3 illustrates a configuration having an 18-bit word width, which uses two FIFO memory chips. Any word width can be attained by adding additional FIFO memory chips of the presently preferred embodiment. Flag detection is accomplished by monitoring FF*, EF* and HF* signals on either (any) device used in the width expansion configuration. The flag output signals should not be directly connected together.

Depth Expansion (Daisy Chain)

The FIFO memory chip of the presently preferred embodiment can easily be adapted to applications when a FIFO depth of more than 4096 words is needed. FIG. 4 demonstrates Depth Expansion block 400, which combines three FIFO memory chips of the presently preferred embodiment to provide a FIFO depth of 12288 bytes. (Of course, by combining additional FIFO chips 100, a greater depth can be provided if desired.)

External logic is needed to generate a composite Full Flag and Empty Flag. This requires the OR-ing of all EF*s and the OR-ing of all FF*s (i.e., all must be set to generate the correct composite FF* or EF*).

The FIFO memory chip of the presently preferred embodiment operates in the Depth Expansion configuration after being Reset under the following conditions:

1. The first device must be designated by grounding the First Load pin (FL*). The Retransmit function is not allowed in the Depth Expansion Mode.
2. All other devices must have FL* in the high state.
3. The Expansion-Out (XO*) pin of each device must be tied to the Expansion-In (XI*) pin of the next device. The half-full capability is not allowed in depth expansion. (Of course, this and other constraints are dictated by the pin allocation used in the package of the presently preferred embodiment, wherein the limited number of pins requires certain pins to be used for different signals in different modes of operation. It will readily be appreciated by those skilled in the art that, if a package with more pins is used, the constraints referred to above can be dispensed with.)

Compound Expansion

Figure 5:
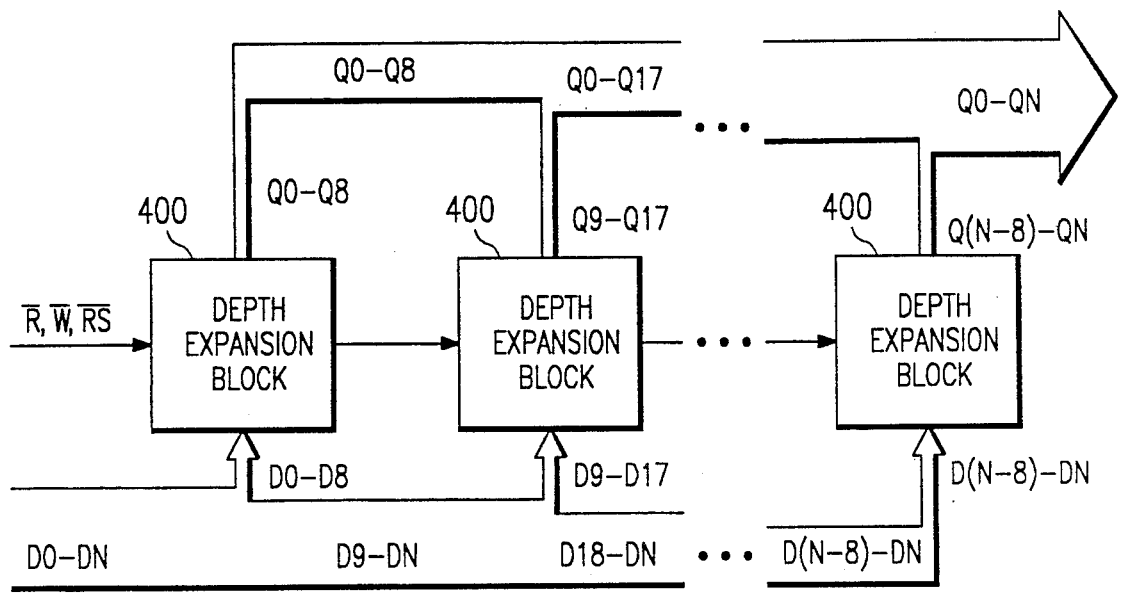
FIG. 5 shows an example of a compound FIFO expansion, wherein both width expansion and depth expansion have been achieved.
Figure 6:
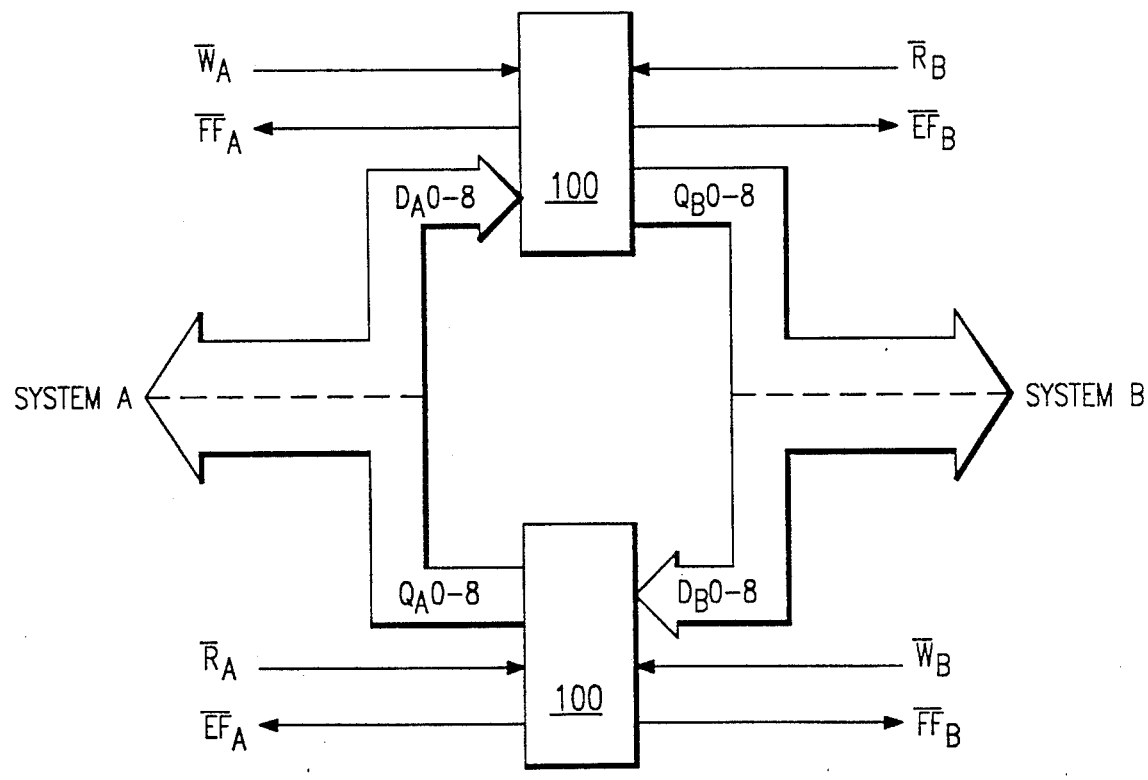
FIG. 6 shows a sample embodiment of a bidirectional FIFO interface, using a FIFO like that shown in FIG. 1.

The two expansion techniques described above can be applied together in a straightforward manner, by width-expanding multiple depth-expansion blocks 400, to achieve large FIFO arrays (see FIG. 5).

Bidirectional Application

Applications which require data buffering between two systems (each system capable of read and write operations), can be achieved by pairing FIFO memory chips of the presently preferred embodiment, as shown (i.e., FF* is monitored on the device where W* is used; EF* is monitored on the device where R* is used). Both Depth Expansion and Width Expansion may be used in this mode.

Half-Full Capability

In the single-device and width-expansion modes, the XO*/HF* output is used as an indication of a half-full memory. (XI* must be tied low.) After half of the memory is filled, and at the falling edge of the next write operation, the Half-Full Flag (HF*) will be set to low, and will remain low until the difference between the write pointer and read pointer is less than or equal to one half of the total memory of the device. The Half-Full Flag (HF*) is then reset (forced high) by the rising edge of the read operation.

Write Mode

Figure 7:
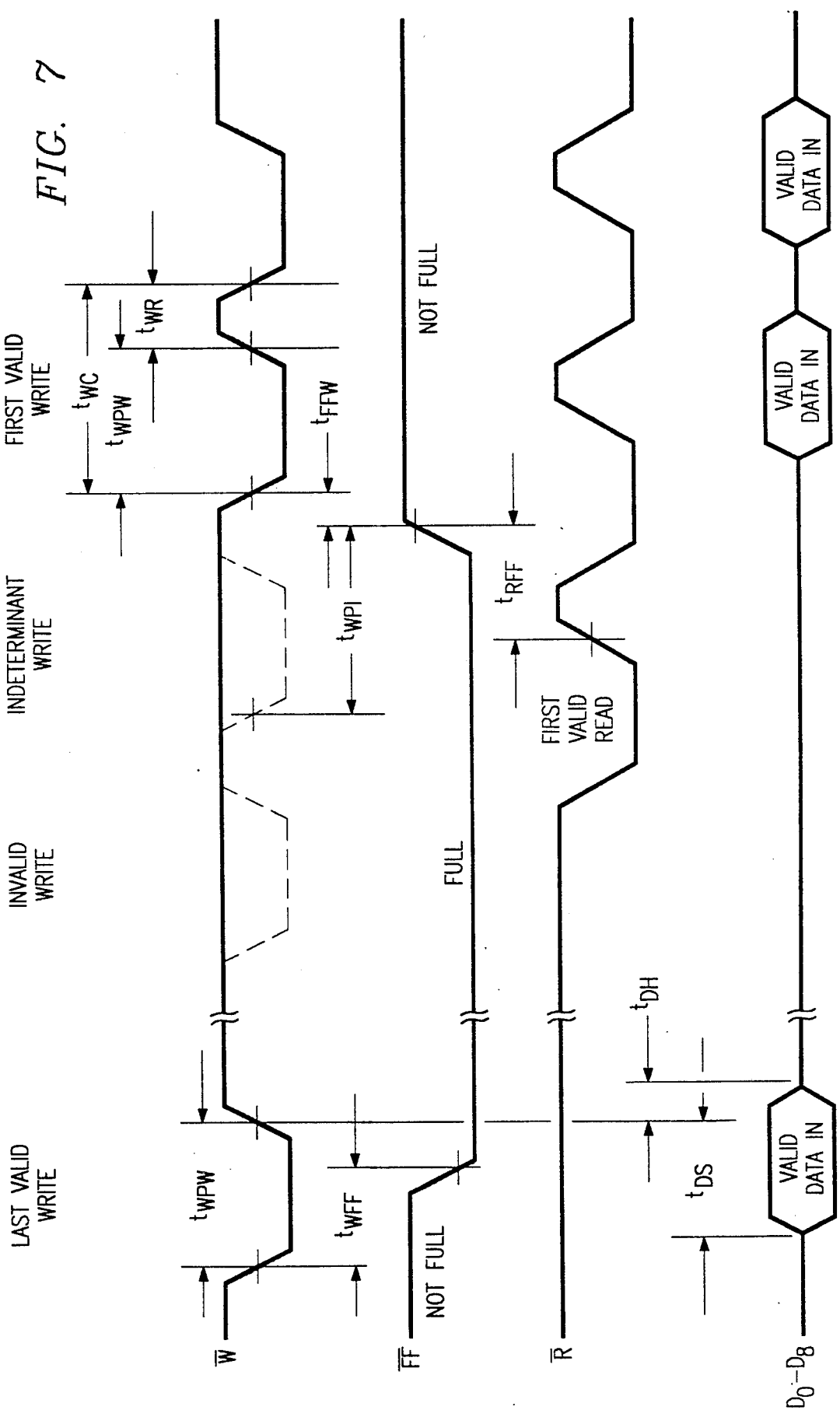
FIG. 7 shows the write timing and "full"-flag timing of the FIFO of the presently preferred embodiment.

The FIFO memory chip of the presently preferred embodiment initiates a Write Cycle (with timing as shown in FIG. 7) on the falling edge of the Write Enable control input (W*), provided that the Full Flag (FF*) is not asserted. Data set-up and hold-time requirements must be satisfied with respect to the rising edge of W*. The data is stored sequentially and independent of any ongoing Read operations. FF* is asserted during the last valid write as the FIFO memory chip of the presently preferred embodiment becomes full. Write operations begun with FF* low are inhibited. FF* will go high $t_{RFF}$ after completion of valid READ operation. Writes beginning after FF* goes low and more than $t_{WPI}$ before FF* goes high are invalid (ignored). Writes beginning less than $t_{WPI}$ before FF* goes high and less than $t_{FFW}$ after FF* goes high may or may not occur (be valid), depending on internal flag status.

Read Mode

Figure 8:
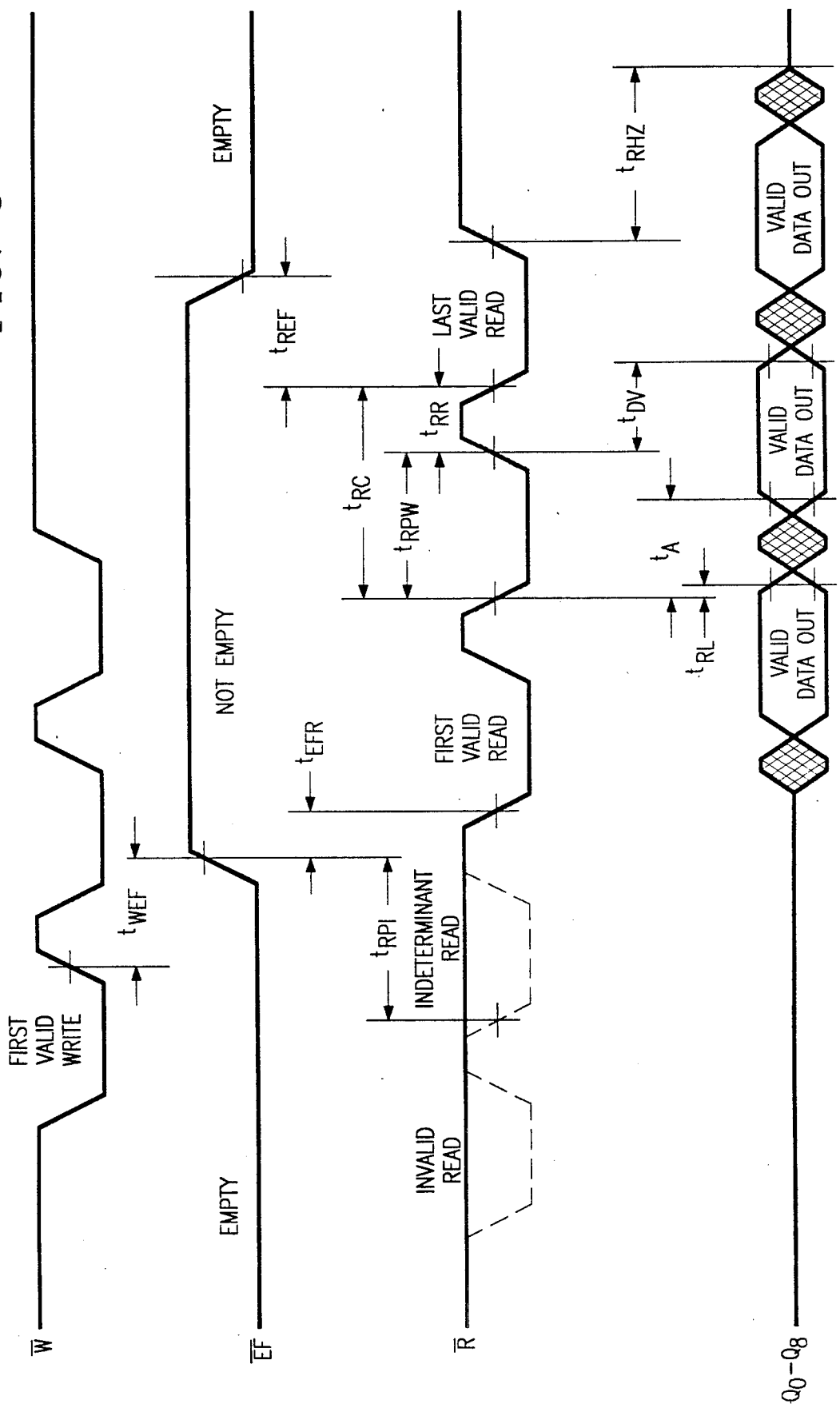
FIG. 8 shows the read timing and "empty"-flag timing of the FIFO of the presently preferred embodiment.

The FIFO memory chip of the presently preferred embodiment initiates a Read Cycle (with timing as shown in FIG. 8) on the falling edge of Read Enable control input (R*), provided that the Empty Flag (EF*) is not asserted. In the Read mode of operation, the FIFO memory chip of the presently preferred embodiment provides a fast access to data from a 9-bit byte in the static storage array 101. The data is accessed on a FIFO basis, independent of any ongoing write operations. After R* goes high, data outputs will return to a high impedance condition until the next Read operation.

In the event that all data has been read from the FIFO, the EF* will go low, and further Read operations will be inhibited (the data outputs will remain in a high impedance condition). EF* is driven low during the last valid read as the FIFO memory chip of the presently preferred embodiment becomes empty. Read operations begun with EF* low are inhibited. EF* will go high $t_{WEF}$ after completion of a valid Write operation. Reads beginning $t_{EFR}$ after EF* goes high are valid. Reads begun after EF* goes low and more than $t_{RPI}$ before EF* goes high are invalid (ignored). Reads beginning less than $t_{RPI}$ before EF* goes high and less than $t_{EFR}$ after EF* goes high may or may not occur (be valid) depending on internal flag status.

Half-full Mode

Unlike the Full Flag and Empty Flag, the Half-Full Flag does not prevent device reads and writes. The flag is set by the next falling edge of write when the memory is 2048 locations full. The flag will remain set until the memory is less than or equal to 2048 locations full. The read operation (rising edge), which results in the memory being 2048 locations full, removes the flag.

RESET

The FIFO memory chip of the presently preferred embodiment is reset whenever the Reset pin RS* is in the low state. During a Reset, both the internal read and write pointers are set to the first location (physical zero in the memory array), flag EF* is set low, HF* and FF* are set high. Reset is required, after a power up, before a Write operation can begin.

Although neither W* or R* need be high when RS* goes low, both W* and R* must be high $t_{RSS}$ before RS* goes high, and must remain high $t_{RSR}$ afterwards. Note that EF*, FF* and HF* may change status during Reset, but flags will be valid at $t_{RSC}$.

Retransmit

The FIFO memory chip of the presently preferred embodiment can be made to retransmit (re-read previously read data) after the Retransmit pin (RT*) is pulsed low.

A Retransmit operation sets the internal read pointer to the first physical location in the array, but will not affect the position of the write pointer. R* must be inactive $t_{RTS}$ before RT* goes high, and must remain high for $t_{RTR}$ afterwards. The EF*, FF* and HF* flags may change status during the retransmit operation, but these flags will be valid at time $t_{RTC}$. The Retransmit function is particularly useful when blocks of less than 4096 Writes are performed between Resets. The Retransmit function, in the presently preferred embodiment, is not compatible with Depth Expansion.

Expansion Timing

The Expansion-Out pin XO* can be connected to the Expansion-In pin XI* of another FIFO, to achieve the expanded configurations referred to above. In this configuration, all of the FIFO chips 100 are connected in a loop, with the expansion-out pin XO* of one FIFO connected to the expansion-in pin XI* of the next. (The user indicates which of the FIFO chips is first by grounding the FL* line of this chip when the RESET occurs.) The FIFO memory chip which is "first" in the depth expansion will begin writing and reading as soon as valid write and read signals begin. As the last physical location in this first chip is being written to, it will pulse its expansion out line XO*, and will cease to respond to write commands (for the time being). Thereafter, as the last physical location in this first chip is being read from, it will again pulse its expansion out line XO*, and will cease to respond to read commands (for the time being). The read and write operations of the other FIFO chips implement a corresponding logical relation: each of the FIFO chips will begin to respond to write commands after a first pulse has appeared on the expansion-in line XI*, will thereafter write sequentially until the last memory location, and will then pulse its expansion out line XO* and cease to respond to write commands (for the time being). Similarly, each of the FIFO chips will begin to respond to read commands after a second pulse has appeared on the expansion-in line XI*, will thereafter read sequentially until the last memory location has been read, and will then again pulse its expansion out line XO* and cease to respond to read commands (for the time being). (Note that, because a FIFO-empty condition inhibits reading, each FIFO is certain to have written its last location, and pulsed the expansion-out line XO*, before a second pulse on line XO* indicates that a read operation has occurred at this location.) When the first FIFO receives an expansion-in pulse, it too will again begin to write data.

Expansion-Out pulses are the image of the write and read signals that cause them, delayed in time by $t_{XOL}$ and $t_{XOH}$. The Expansion-Out signal is propagated when the last physical location in the memory array is written (Last Write) and again when it is read (Last Read). (Note that this is a different condition than that which causes the Full and Empty Flags to be activated, which is in response to writing and reading a last available location.)

The specified values for the time margins referred to above, in one example of the presently preferred embodiment, are as follows:

| | |
|---|---|
| Read Cycle Time $t_{RC}$ | 100 nsec Min |
| Access Time $t_A$ | 80 nsec Max |
| Read Recovery Time $_{RR}$ | 20 nsec Min |
| Read Pulse Width $t_{RPW}$ | 80 nsec Min |
| R* Low to Low Z $t_{RL}$ | 10 nsec Min |
| Data Valid from R* High $t_{DV}$ | 5 nsec Min |
| R* High to High Z $t_{RHZ}$ | 25 nsec Max |
| R* Low to EF* Low $t_{REF}$ | 70 nsec Max |
| EF* High to Valid Read $t_{EFR}$ | 20 nsec Max |
| W* High to EF* High $t_{WEF}$ | 70 nsec Max |
| Read Protect Indeterminant $t_{RPI}$ | 25 nsec Max |
| Write Low to Half-Full Flag Low $t_{WHF}$ | 100 nsec Max |
| Read High to Half-Full Flag High $t_{RFH}$ | 100 nsec Max |
| Write Cycle Time $t_{WC}$ | 100 nsec Min |
| Write Pulse Width $t_{WPW}$ | 80 nsec Min |
| Write Recovery Time $t_{WR}$ | 20 nsec Min |
| Data Set Up Time $t_{DS}$ | 20 nsec Min |
| Dat Hold Time $t_{DH}$ | 10 nsec Min |
| W* Low to FF* Low $t_{WFF}$ | 70 nsec Max |
| FF* High to Valid Write $t_{FFW}$ | 10 nsec Max |
| R* High to FF* High $t_{RFF}$ | 70 nsec Max |
| Write Protect Indeterminant $t_{WPI}$ | 25 nsec Max |
| Reset Cycle Time $t_{RSC}$ | 100 nsec Min |
| Reset Pulse Width $t_{RS}$ | 80 nsec Min |
| Reset Recovery Time $t_{RSR}$ | 20 nsec Min |
| Reset Set Up Time $t_{RSS}$ | 60 nsec Min |
| Expansion Out Low $t_{XOL}$ | 70 nsec Max |
| Expansion Out High $t_{XOL}$ | 70 nsec Max |
| Expansion in Pulse Width $t_{XI}$ | 80 nsec Min |
| Expansion in Recovery Time $t_{XIR}$ | 20 nsec Min |
| Expansion in Set Up Time $t_{XIS}$ | 30 nsec Min |
| Retransmit Cycle Time $t_{RTC}$ | 100 nsec Min |
| Retransmit Pulse Width $t_{RT}$ | 80 nsec Min |
| Retransmit Recovery Time $t_{RTR}$ | 20 nsec Min |
| Retransmit Set Up Time $t_{RTS}$ | 60 nsec Min |

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested herein are merely illustrative. These examples may help to show some of the scope of the inventive concepts, but these examples do not nearly exhaust the full scope of variations in the disclosed novel concepts.

For example, the disclosed innovative architectural concepts can also be applied to other memory types, such as a sequential memory which includes the capability to interleave inputs from multiple sources, or to a sequential memory which has more than two ports. A very simple example is the use of multiple subarrays: as is well known to those skilled in the art of memory design, very large arrays of memory cells may impose some degradation on the cell access time, due to the series resistance and capacitive loading of the long word lines. Therefore, as memories are made larger, it is common practice to use multiple subarrays in place of one large array. Thus, for example, if it was desired to build a fast 64K by 9 FIFO according to the present invention, one straightforward approach would be to use 16 arrays, each including blocks 902 and repeaters 903 like those shown in FIG. 9. The read address pointer logic 914/916 and the column address pointer logic 924'/926'/924"/926" would be partly replicated for each subarrays, and these pointer logic blocks would be linked together to implement a sequence relation from one subarray to another.

As will be recongnized by those skilled in the art, the innovative concepts described in the present application can be modified and varied over a tremendous range of applications, and accordingly their scope is not limited except by the allowed claims.

What is claimed is:

1. A sequential-access multiport memory, comprising:
   an array of memory cells;
   a first set of peripheral circuits, connected to access multiple bits of data in parallel at each address of said array, and a second set of peripheral circuits, connected to access multiple bits of data in parallel at each address of said array;
   write access control logic, connected to receive an external write command, and accordingly to perform write operations, wherein
      externally received data is written, through said first set of peripheral circuits, into a location in said memory array indicated by a write address pointer, and
      said write address pointer is updated;
   read access control logic, connected to receive an external read command, and accordingly to perform read operations, wherein
      data is read, through said second set of peripheral circuits, from a location in said memory array indicated by a read address pointer, and
      said read address pointer is updated;
   a plurality of output buffers, connected in parallel to receive data signals from said read control logic and to drive corresponding data signals onto multiple output connections of said memory, and to provide a high-impedance output at other times; and
   a dummy row of memory cells, which has parameters substantially matching the rows of memory cells in said memory array, and wherein said read control logic is connected so that the timing of a reading of said memory array by said read control logic is conditioned on a delay which is dependent on a time constant of said dummy row.

2. The sequential-access memory of claim 1, wherein said write access control logic increments said write address pointer after certain write operations, said read access control logic increments said read address pointer after certain read operations.

3. The sequential-access memory of claim 1, wherein said write access control logic increments said write address pointer after certain write operations, and said read access control logic decrements said read address pointer after certain read operations.

4. The sequential-access memory of claim 1, wherein said array is physically configured to include first and second half-arrays, and said peripheral circuits and said read and write access control logic are connected so that, after a write operation has occured in a row within said first half-array, no further write operation will occur in any other row of said first half-array until a write operation has also occurred within the corresponding row of said second half-array.

5. The sequential-access memory of claim 1, wherein said array is physically configured to include first and second half-arrays, and said peripheral circuits and said read and write access control logic are connected so that, after a write operation has occured in a row within said first half-array, no further write operation will occur in any other row of said first half-array until a write operation has also occurred within the corresponding row of said second half-array, and said write control logic maintains said write address pointer as separate values for said first and second half-arrays, and wherein said first half-array write address pointer value is is updated while a write operation is occuring in said second half-array, and said second half-array write address pointer value is updated while a write operation is occurring in said first half-array.

6. The sequential-access memory of claim 1, wherein said array is physically configured to include first and second half-arrays, and said peripheral circuits and said read and write access control logic are connected so that, after a write operation has occurred in a row within said first half-array, no further write operation will occur in any other row of said first half-array until a write operation has also occurred within the corresponding row of said second half-array, and said write control logic maintains said write address pointer as separate values for said first and second half-arrays, and wherein said first half-array write address pointer value is updated while a write operation is occurring in said half-array, and said second half-array write address pointer value is updated while a write operation is occurring in said first half-array; and wherein said array includes multiple subarrays, and each said subarray includes portions of said first and second half-arrays.

7. The sequential-access memory of claim 1, wherein said array is physically configured to include first and second half-arrays, and said peripheral circuits and said read and write access control logic are connected so that, after a write operation has occured in a row within said first half-array, no further write operation will occur in any other row of said first half-array until a write operation has also occurred within the corresponding row of said second half-array, and said read control logic maintains said read address pointer as separate values for said first and second half-arrays, and wherein said first half-array read address pointer value is updated while a read operation is occurring in said second half-array, and said second half-array read address pointer value is updated while a read operation is occurring in said first half-array.

8. The sequential-access memory of claim 1, wherein said array is physically configured to include first and second half-arrays, and said peripheral circuits and said read and write access control logic are connected so that, after a write operation has occurred in a row within said first half-array, no further write operation will occur in any other row of said first half-array until a write operation has also occurred within the corresponding row of said second half-array, and said read control logic maintains said read address pointer as separate values for said first and second half-arrays, and wherein said first half-array read address pointer value is updated while a read operation is occurring in said second half-array, and said second half-array read address pointer value is updated while a read operation is occurring in said first half-array; wherein said array includes multiple subarrays, and each said subarray includes portions of said first and second half-arrays.

9. The sequential-access memory of claim 1, further comprising flag logic, which monitors said write address pointer and said read address pointer, and provides full and empty output flags accordingly.

10. The sequential-access memory of claim 1, further comprising flag logic, which monitors said write address pointer and said read address pointer, and provides full, half-full, and empty output flags accordingly.

11. The sequential-access memory of claim 1, further comprising a plurality of output buffers, connected to receive data signals from said sense amplifier functions of said read control logic and to drive corresponding data signals onto output connections of said memory, and to provide a high-impedance output at other times.

12. The sequential-access memory of claim 1, further comprising expansion logic connected to receive an incoming expansion signal and an provide an outgoing expansion signal, to inhibit reading and writing of said memory array and to disable said operations of updating said write address pointer and said read address pointer if a sequence of said incoming expansion signals indicates that the integrated circuit has been deselected.

13. The sequential-access memory of claim 1, further comprising expansion logic connected: to receive an incoming expansion signal and an provide an outgoing expansion signal; to inhibit reading and writing of said memory array and to disable said operations of updating said write address pointer and said read address pointer if said incoming expansion signal indicates that the integrated circuit has been deselected; and to provide a signal on said outgoing expansion line if one of said read and write address pointers indicates that the depth of said memory array has been reached.

14. The sequential-access memory of claim 1, wherein said memory array comprises a plurality of static memory cells each connectable to a first pair of bit lines if selected by a first word line, and also connectable to a second pair of bit lines if selected by a second word line.

15. The sequential-access memory of claim 1, wherein said array of memory cells is physically dual-ported to provide read access by said read control logic completely independently of any write access activities by said write control logic.

16. The sequential-access memory of claim 1, further comprising reset logic connected to reset said read address pointer and said write address pointer on command.

17. The sequential-access memory of claim 1, wherein said read control logic and said write control logic are configured to implement a first-in-first-out (FIFO) functionality.

18. The sequential-access memory of claim 1, wherein said read control logic and said write control logic are configured to implement a last-in-first-out (LIFO) functionality.

19. A sequential-access multiport memory, comprising:
an array of memory cells;
a first set of peripheral circuits, connected to access bits of data at each address of said array, and a second set of peripheral circuits, connected to access bits of data at each address of said array;
write access control logic, connected to receive an external write command, and accordingly to perform write operations, wherein
externally received data is written, through said first set of peripheral circuits, into a location in said memory array indicated by a write address pointer, and said write address pointer is updated;
read access control logic, connected to receive an external read command, and accordingly to perform read operations, wherein
data is read, through said second set of peripheral circuits, from a location in said memory array indicated by a read address pointer, and
said read address pointer is updated;
a dummy row of memory cells, which has parameters substantially matching the rows of memory cells in said memory array, and wherein said read control logic is connected so that the timing of a reading of said array by said read control logic is conditioned on a delay which is dependent on a time constant of said dummy row.

20. The sequential-access memory of claim 19, wherein said write access control logic increments said write address pointer after certain write operations, and said read access control logic decrements said read address pointer after certain read operations.

21. The sequential-access memory of claim 19, wherein said write access control logic increments said write address pointer after certain write operations, and said read access control logic increments said read address pointer after certain read operations.

22. The sequential-access memory of claim 19, further comprising a plurality of output buffers, connected to receive data signals from said sense amplifier functions of said read control logic and to drive corresponding data signals onto output connections of said memory, and to provide a high-impedance output at other times; wherein, during each read operation, multiple ones of said output buffers all provide separate data outputs in parallel, and at least two different ones of said output buffers begin to drive data signals at slightly different times, with a relative timing determined by physically spaced-apart connections to said dummy row line.

23. The sequential-access memory of claim 19, further comprising a plurality of output buffers, connected to receive data signals from said sense amplifier functions of said read control logic and to drive corresponding data signals onto output connections of said memory, and to provide a high-impedance output at other times; wherein, during each read operation, multiple ones of said output buffers all provide separate data outputs in parallel, and at least two different ones of said output buffers begin to drive data signals at slightly different times.

24. The sequential-access memory of claim 19, wherein said memory array comprises a plurality of static memory cells each connectable to a first pair of bit lines if selected by a first word line, and also connectable to a second pair of bit lines if selected by a second word line.

25. The sequential-access memory of claim 19, wherein said array stores at least four bits of data in parallel at each address of said array.

26. The sequential-access memory of claim 19, wherein said array stores 8 bits of data in parallel at each address of said array.

27. The sequential-access memory of claim 19, wherein said array stores 9 bits of data in parallel at each address of said array.

28. The sequential-access memory of claim 19, wherein said array stores 16 bits of data in parallel at each address of said array.

29. A sequential-access multiport memory, comprising:
- an array of memory cells;
- peripheral circuits connected to access data at address of said array;
- write access control logic, connected to receive an external write command, and accordingly to perform write operations, wherein
  - externally received data is written, through said peripheral circuits, into a location in said memory array indicated by a write address pointer, and
  - said write address pointer is updated;
- read access control logic, connected to receive an external read command, and accordingly to perform read operations, wherein
  - data is read, through said peripheral circuits, from a location in said memory array indicated by a read address pointer, and
  - said read address pointer is updated;
- a plurality of output buffers, connected in parallel to receive data signals from sense amplifier functions of said read control logic and to drive corresponding data signals onto multiple output connections of said memory, and to provide a high-impedance output at other times; and
- a transmission line having multiple spaced taps therein, wherein during a given read operation,
  - at least a first one of said output buffers is connected to make a transition, from said high-impedance state to driving valid data onto a respective output connection, with a relative time delay which is determined by the delay to a first one of said taps,
  - and at least a second one of said output buffers is connected to make a transition, from said high-impedance state to driving valid data onto a respective output connection, during a read operation, with a different relative time delay which is determined by the delay to a second one of said taps.

30. The sequential-access memory of claim 29, wherein said write access control logic increments said write address pointer after certain write operations, and said read access control logic increments said read address pointer after certain read operations.

31. The sequential-access memory of claim 29, wherein said write access control logic increments said write address pointer after certain write operations, and said read access control logic decrements said read address pointer after certain read operations.

32. The sequential-access memory of claim 29, further comprising flag logic, which monitors said write address pointer and said read address pointer, and provides full and empty output flags accordingly.

33. The sequential-access memory of claim 29, wherein said array is arranged in columns of memory cells, and includes a plurality of word lines which access respective rows of said array, and wherein said transmission line is a dummy word line which has electrical parameters substantially corresponding to said word lines.

34. The sequential-access memory of claim 29, wherein said array is arranged in first and second half-arrays each including multiple columns of memory cells, and said array also includes a plurality of word lines which access respective rows of said array, and wherein said transmission line is a dummy word line which has electrical parameters substantially corresponding to said word lines, and wherein said first output buffer is connected to receive data from at least a first column of said array, and wherein said second output buffer is connected to receive data from at least a second column of said array, and wherein said first and second taps of said dummy word line approximately correspond to the respective relative spacing of said first and second columns along word lines of said array, and wherein, during a read operation which accesses one or more columns in said left half-array, said first output buffer makes said transition out of said high-impedance state before said second output buffer, and, during a read operation which accesses one or more columns in said right half-array, said first output buffer makes said transition out of said high-impedance state after said second output buffer.

35. The sequential-access memory of claim 29, wherein said array is arranged in columns of memory cells, and includes a plurality of word lines which access respective rows of said array, and wherein said transmission line is a dummy word line which has electrical parameters substantially corresponding to said word lines, and wherein said first output buffer is connected to receive data from at least a first column of said array, and wherein said second output buffer is connected to receive data from at least a second column of said array, and wherein said first and second taps of said dummy word line approximately correspond to the respective relative spacing of said first and second columns along word lines of said array.

36. A sequential-access memory, comprising:
- an array of memory cells;
- peripheral circuits connected to access data at address of said array;
- write access control logic, connected to receive an external write command, and accordingly to perform write operations, wherein
  - externally received data is written into a location in said memory array indicated by a write address pointer, and
  - said write address pointer is stepped;
- read access control logic, connected to receive an external read command, and accordingly to perform read operations, wherein
  - data is read from a location in said memory array indicated by a read address pointer, and
  - said read address pointer is stepped,
  - wherein the timing of said read operation is substantially asynchronous to the timing of said write operations;
- a dummy row of memory cells, which has parameters substantially matching the rows of memory cells in said memory array, and wherein said read control logic is connected so that the timing of a reading of said array by said read control logic is conditioned on a delay which is dependent on a time constant of said dummy row.

37. The sequential-access memory of claim 36, wherein said read control logic and said write control logic are configured to implement a last-in-first-out (LIFO) functionality.

38. The sequential-access memory of claim 36, wherein said write access control logic increments said write address pointer after certain write operations, and said read access control logic increments said read address pointer after certain read operations.

39. The sequential-access memory of claim 36, wherein said write access control logic increments said write address pointer after certain write operations, and said read access control logic decrements said read address pointer after certain read operations.

40. The sequential-access memory of claim 36, wherein said array is physically configured to include first and second half-arrays, and said peripheral circuits, and said read and write access control logic are connected so that, after a write operation has occurred in a row within said first half-array, no further write operation will normally occur in any other row of said first half-array until a write operation has also occurred within the corresponding row of said second half-array.

41. The sequential-access memory of claim 36, further comprising flag logic, which monitors said write address pointer and said read address pointer, and provides full and empty output flags accordingly.

42. The sequential-access memory of claim 36, further comprising a plurality of output buffers, connected to receive data signals from said sense amplifier functions of said read control logic and to drive corresponding data signals onto output connections of said memory, and to provide a high-impedance output at other times; wherein, during each read operation, multiple ones of said output buffers all provide separate data outputs in parallel, and at least two different ones of said output buffers begin to drive data signals at slightly different times, with a relative timing determined by physically spaced-apart connections to said dummy row line.

43. The sequential-access memory of claim 36, further comprising a plurality of output buffers, connected to receive data signals from said sense amplifier functions of said read control logic and to drive corresponding data signals onto output connections of said memory, and to provide a high-impedance output at other times; wherein, during each read operation, multiple ones of said output buffers all provide separate data outputs in parallel, and at least two different ones of said output buffers begin to drive data signals at slightly different times.

44. The sequential-access memory of claim 36, further comprising expansion logic connected to receive an incoming expansion signal and an provide an outgoing expansion signal, to inhibit reading and writing of said memory array and to disable said operations of updating said write address pointer and said read address pointer if a sequence of said incoming expansion signals indicates that the integrated circuit has been deselected.

45. The sequential-access memory of claim 36, wherein said memory array comprises a plurality of static memory cells each connectable to a first pair of bit lines if selected by a first word line, and also connectable to a second pair of bit lines if selected by a second word line.

46. The sequential-access memory of claim 36, wherein said array of memory cells is physically dual-ported to provide read access by said read control logic completely independently of any write access activities by said write control logic.

47. A sequential-access memory, comprising:
an array of memory cells arranged in rows and columns, comprising first and second half-arrays;
peripheral circuits connected to access data at addresses of said array;
write access control logic, connected to receive an external write command, and accordingly to perform write operations, wherein
externally received data is written into a location in said memory array indicated by a write address pointer, and
said write address pointer is stepped;
read access control logic, connected to receive an external read command, and accordingly to perform read operations, wherein
data is read from a location in said memory array indicated by a read address pointer, and
said read address pointer is stepped,
wherein the timing of said read operation is substantially asynchronous to the timing of said write operations;
wherein said peripheral circuits and said read and write access control logic are conected so that, after a write operation has occurred in a row within said first half-array, no further write operation will occur in any other row of said first half-array until a write operation has also occurred within the corresponding row of said second half-array;
wherein said array includes multiple subarrays, and each said subarray includes multiple blocks of memory cells on a left half-subarray thereof, and multiple blocks of memory cells on a right half-subarray thereof.

* * * * *